(12) United States Patent
Bhatia et al.

(10) Patent No.: US 10,326,414 B2
(45) Date of Patent: *Jun. 18, 2019

(54) DYNAMIC BIASING OF POWER AMPLIFIERS

(71) Applicant: MaxLinear, Inc., Carlsbad, CA (US)

(72) Inventors: Rahul Bhatia, San Marcos, CA (US); Timothy Gallagher, Encinitas, CA (US); Raja Pullela, Irvine, CA (US); Sridhar Ramesh, San Diego, CA (US)

(73) Assignee: MAXLINEAR, INC., Carlsbad, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/700,732

(22) Filed: Sep. 11, 2017

(65) Prior Publication Data

US 2018/0069512 A1    Mar. 8, 2018

Related U.S. Application Data

(63) Continuation of application No. 14/603,993, filed on Jan. 23, 2015, now Pat. No. 9,762,189.

(60) Provisional application No. 61/930,553, filed on Jan. 23, 2014.

(51) Int. Cl.
*H03F 3/21* (2006.01)
*H03F 3/45* (2006.01)
*H03F 1/02* (2006.01)

(52) U.S. Cl.
CPC ............. *H03F 3/21* (2013.01); *H03F 1/0266* (2013.01); *H03F 3/4508* (2013.01); *H03F 2200/09* (2013.01); *H03F 2200/66* (2013.01); *H03F 2203/45731* (2013.01)

(58) Field of Classification Search
USPC .................................. 330/136, 296–297, 149
See application file for complete search history.

(56) References Cited

U.S. PATENT DOCUMENTS

| | | | |
|---|---|---|---|
| 7,268,626 B2 | 9/2007 | Anand | |
| 7,525,377 B2* | 4/2009 | Altham | H03F 1/0211 330/10 |
| 8,190,107 B1* | 5/2012 | Gilbert | H03D 1/10 455/108 |
| 2014/0184336 A1 | 7/2014 | Nobbe et al. | |

* cited by examiner

*Primary Examiner* — Hieu P Nguyen
(74) *Attorney, Agent, or Firm* — McAndrews, Held & Malloy, Ltd.

(57) ABSTRACT

Systems and methods are provided for dynamically biasing power amplifiers. A power amplifier (PA) that amplifies an input signal may be controlled based on processing of the input signal. The controlling may include adjusting biasing applied to the power amplifier (PA). The processing of the input signal may include applying clipping to the input signal and determining one or more parameters of the input signal. The biasing applied to the power amplifier (PA) may be adjusted based on the one or more parameters of the input signal. The clipping may be configured such that signals applied to positive and negative sides of the power amplifier (PA) are not differential.

16 Claims, 6 Drawing Sheets

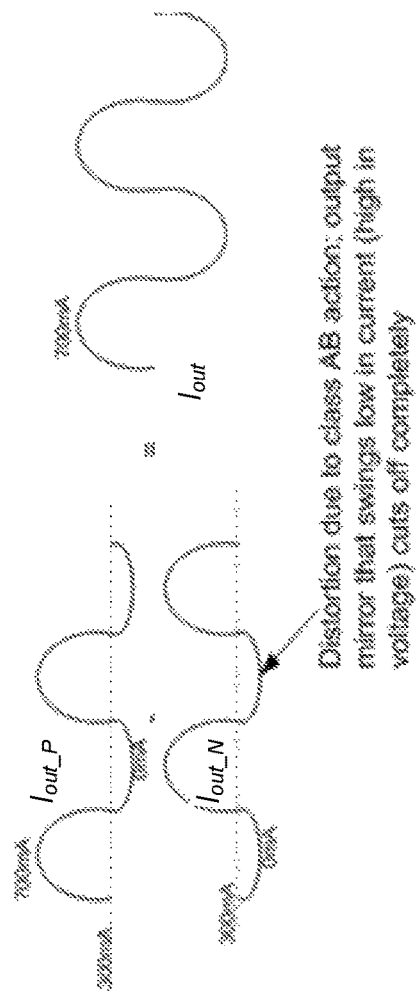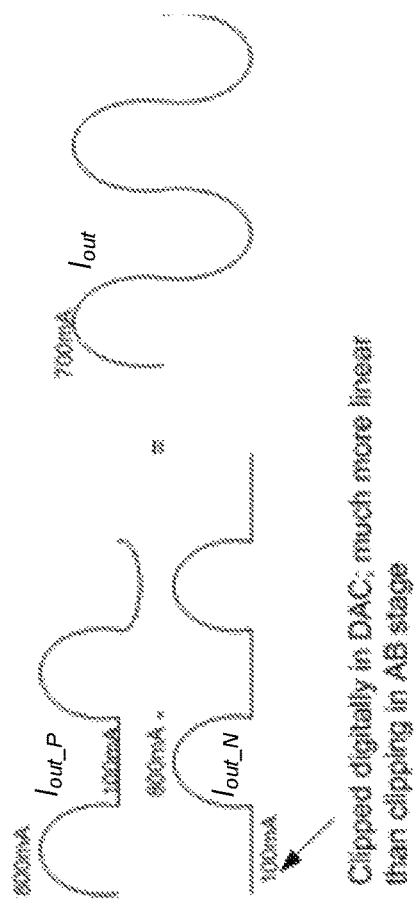
FIG. 5A
FIG. 5B

DYNAMIC BIASING OF POWER AMPLIFIERS

CLAIM OF PRIORITY

This patent application is a continuation of U.S. Provisional patent application Ser. No. 14/603,993, filed Jan. 23, 2015, which makes reference to, claims priority to and claims benefit from the U.S. Provisional Patent Application Ser. No. 61/930,553, filed Jan. 23, 2014. Each of the above identified applications is hereby incorporated herein by reference in its entirety.

TECHNICAL FIELD

Aspects of the present disclosure relate to communication systems and technologies. More specifically, certain implementations of the present disclosure relate to methods and systems for dynamic biasing of power amplifiers.

BACKGROUND

Conventional systems and methods for biasing power amplifiers may be costly, cumbersome and inefficient—e.g., resulting in excessive power consumption and heat. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for dynamic biasing of power amplifiers, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 5A depicts example output current waveforms without action having been taken to prevent clipping in a power amplifier.

FIG. 5B depicts example output current waveforms with digital clipping and corresponding compensation in a power amplifier.

DETAILED DESCRIPTION OF THE INVENTION

As utilized herein the terms ""circuits"" and ""circuitry"" refer to physical electronic components (e.g., hardware), and any software and/or firmware (""code"") that may configure the hardware, be executed by the hardware, and or otherwise be associated with the hardware. As used herein, for example, a particular processor and memory (e.g., a volatile or non-volatile memory device, a general computer-readable medium, etc.) may comprise a first ""circuit"" when executing a first one or more lines of code and may comprise a second ""circuit"" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc. Similarly, the term ""module"" may, for example, refer to a physical electronic components (e.g., hardware) and any software and/or firmware (""code"") that may configure the hardware, be executed by the hardware, and or otherwise be associated with the hardware.

As utilized herein, circuitry or module is ""operable"" to perform a function whenever the circuitry or module comprises the necessary hardware and code (if any is necessary) to perform the function, regardless of whether performance of the function is disabled or not enabled (e.g., by a user-configurable setting, factory trim, etc.).

As utilized herein, ""and/or"" means any one or more of the items in the list joined by ""and/or"". As an example, ""x and/or y"" means any element of the three-element set $\{(x), (y), (x, y)\}$. In other words, ""x and/or y"" means ""one or both of x and y."" As another example, ""x, y, and/or z"" means any element of the seven-element set $\{(x), (y), (z), (x, y), (x, z), (y, z), (x, y, z)\}$. In other words, ""x, y and/or z"" means ""one or more of x, y, and z."" As utilized herein, the term ""exemplary"" means serving as a non-limiting example, instance, or illustration. As utilized herein, the terms ""for example"" and ""e.g."" set off lists of one or more non-limiting examples, instances, or illustrations.

Figure 1:
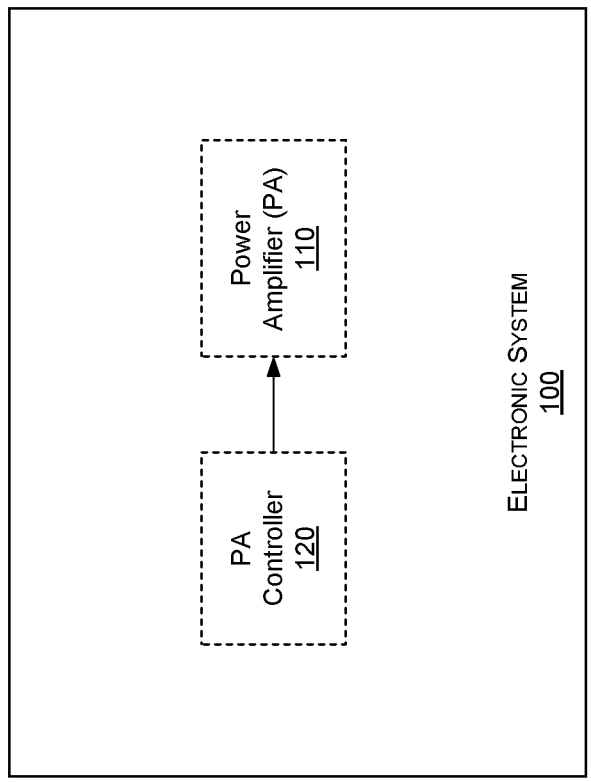
FIG. 1 illustrates an example electronic system that uses power amplifiers.

FIG. 1 illustrates an example electronic system that uses power amplifiers. Shown in FIG. 1 is an electronic system 100.

The electronic system 100 may comprise suitable circuitry for implementing various aspects of the present disclosure. For example, the electronic system 100 may be configured to perform, execute, or run various operations, functions, applications and/or services, such as based on pre-configured data (e.g., pre-programmed instructions or settings), real-time data (e.g., user instructions, sensory information, etc.), and the like. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), and the like.

In some instances, the electronic system 100 may be operable to perform or support communication of data. In this regard, the electronic system 100 may need to communicate with other systems (local or remote), such as during executing, running, and/or performing of operations, func-"

tions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols. Examples of wireless protocols or standards that may be supported and/or used by the communication subsystem 250 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+(e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 250 comprise Ethernet (IEEE 802.3), Fiber Distributed Data Interface (FDDI), Integrated Services Digital Network (ISDN), cable television and/or internet (ATSC, DVB-C, DOCSIS), and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be operable to perform or support input/output operations, such as to allow providing output to and/or obtaining input from user(s) of the electronic system 100. In this regard, the electronic system 100 may comprise components or subsystems for enabling obtaining user input and/or to provide output to the user. For example, the electronic system 100 may be operable to support audio output operations, whereby acoustic signals may be generated and/or outputted via suitable output devices (e.g., loudspeakers). In this regard, the output signals may be generated based on content, which may be in digital form (e.g., digitally formatted music or the like).

Examples of electronic systems may comprise handheld electronic devices (e.g., cellular phones, smartphones, or tablets), personal computers (e.g., laptops or desktops), servers, dedicated media devices (e.g., televisions, game consoles, or portable media players, etc.), set-top boxes (STBs) or other similar receiver systems (e.g., satellite receivers), and the like. The disclosure, however, is not limited to any particular type of electronic system.

In operation, the electronic system 100 may be configured to perform various operations, functions, applications and/or services. In some instances, the operations, functions, applications and/or services performed by the electronic system 100 may entail or comprise generating and/or processing signals—e.g., signals transmitted or received by the system (e.g., when communicating with other systems or devices), signals input by or output to system users (e.g., audio, video, and the like), etc. Such generating and/or processing of signals may entail or comprise performing various functions or operations, including for example, amplification. In this regard, amplification may comprise increasing the power of a signal. Accordingly, the electronic system 100 may incorporate suitable components (e.g., electronic components or circuits) for providing or performing such amplification functions.

For example, the electronic system 100 may comprise one or more power amplifiers (PA) 110, which may be used in amplifying signals. Each PA 110 may comprise suitable circuitry for performing power amplification. Power amplification may be characterized in that typically it may be the last 'amplification' stage in a signal processing chain (e.g., at the output stage). The PA 110 may be utilized, for example, during signal processing, such as in a transmit path, when signals that are to-be transmitted are generated and/or configured by the electronic system 100. The use of PA 110, however, is not limited to use in transmission and in transmit paths, and the PA 110 may be used for any suitable scenario where power amplification may be needed.

Various considerations may be pertinent to the design and implementation (and use) of power amplifiers. One of these considerations is power consumption of power amplifiers. For example, power consumption of power amplifiers impacts the temperature of the component (e.g., die) in which the power amplifiers are incorporated, and therefore necessitates careful thermal management—e.g., using heat sinks, thick ground traces (e.g., on printed circuit boards (PCB)), and other such methods to keep the die temperature within reliable limits. Such thermal management methods may, however, increase the cost and complexity of the system and provide motivation for reducing the power consumption while still meeting performance targets.

Further, one of the performance metrics for power amplifiers is efficiency, which may be affected by power consumption—efficiency being determined, for example, based on the ratio of the output power of the power amplifier (e.g., power delivered to load) to the DC power consumed. Thus, power amplifies used in applications that use signals with a large peak-to-average power ratio (PAPR), for example, may typically have poor efficiency because the DC power is decided by the peak signal power while the delivered power is decided by the root mean square (RMS) signal power. Although the large peaks may happen infrequently, the peaks determine both the required DC current and the supply voltage of the power amplifier. The efficiency of the power amplifier may be improved if the current of the power amplifier can be provided on an on-demand basis for the large peaks. This technique is referred to henceforth as "dynamic biasing."

Accordingly, in various implementations in accordance with the present disclosure, dynamic biasing of power amplifiers may be used to control and optimize power consumption, and correspondingly related characteristics and/or metrics, of power amplifiers. For example, dedicated components may be used to drive and control operations of power amplifiers, with these components being particularly configured to dynamically bias the power amplifiers, and to particularly use that dynamic biasing to enhance the efficiency of the power amplifier. As shown in the example implementation depicted in FIG. 1, the electronic system 100 may comprise one or more power amplifier (PA) controllers 120. Each PA controller 120 may comprise suitable circuitry from driving and controlling at a corresponding PA 110, whereby the PA controller 120 may dynamically bias the corresponding PA 110 and particularly adjust the dynamic biasing to enhance the power efficiency of that amplifier. An example implementation is described in more detail with respect to FIG. 2.

Figure 2:
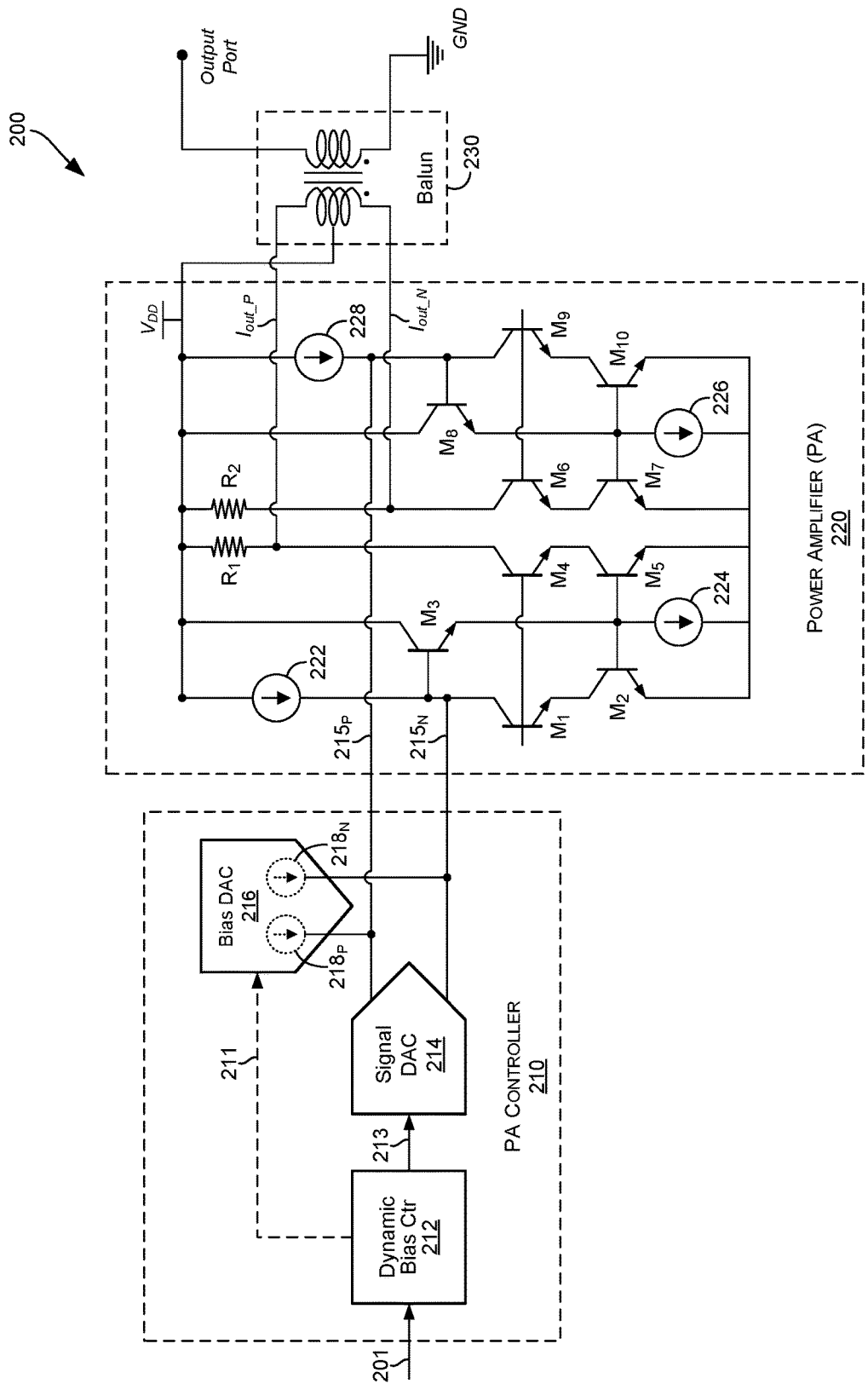
FIG. 2 depicts an example system (e.g., transmitter) that is operable to perform dynamic biasing of its power amplifier, in accordance with an implementation of the present disclosure.

FIG. 2 depicts an example system (e.g., transmitter) that is operable to perform dynamic biasing of its power amplifier, in accordance with an implementation of the present disclosure. Shown in FIG. 2 is an example electronic system (e.g., transmitter) 200, or a portion thereof.

The transmitter 200 may comprise suitable circuitry for processing signals, such as during transmission of such signals. The transmitter 200 may be operable, in this respect, to perform various operations or functions, including power amplification. In particular, the transmitter 200 may be operable to perform power amplification, and to particularly support dynamic biasing of power amplifiers. In the example implementation depicted in FIG. 2 (corresponding to a portion of the transmitter 200 configurable for dynamic biasing of power amplifiers) may comprise a power amplifier (PA) controller 210, a power amplifier (PA) 220, and a balun 230.

The PA controller 210 may comprise suitable circuitry for driving and controlling the PA 220. In particular, the PA controller 210 may be operable to, when driving and/or controlling the PA 220, to dynamically bias the PA 220, such as to enhance efficiency of the PA 220, as described in more detail below. In the example implementation depicted in FIG. 2, the PA controller 210 may comprise a dynamic biasing control circuit 212, a signal digital-to-analog (DAC) circuit 214, and a bias digital-to-analog (DAC) circuit 216.

The PA 220 may comprise suitable circuitry for performing power amplification. Various architectures and/or designs may be used in implementing the PA 220 (e.g., in accordance with one or more pre-defined classes). The PA 220 may be implemented as transistor-based (e.g., bipolar junction transistors (BJTs), field-effect transistor (FETs), etc.) current mode amplifier, with low input impedance. For example, as shown in the particular example implementation depicted in FIG. 2, the PA 220 may comprise a combination of transistors (e.g., NPN BJTs M1 to M10), resistors (e.g., R1 and R2), and current sources (e.g., 222, 224, 226, and 226), arranged in one or more branches connected to a common source ($V_{DD}$), to create biased output using positive and negative output currents ($I_{out\_P}$ and $I_{out\_N}$). The number and/or type of components, and/or the manner by which these components are arranged (in the branches) may be design or implementation specific, based on certain pre-determined or pre-select performance metrics, to provide particular operation within certain range.

The balun 230 may comprise suitable circuitry for coupling balanced and unbalanced lines (e.g., connectors). In particular, as used in the example implementation depicted in FIG. 2, the balun 230 is operable to convert the differential outputs of the PA 220 to single output.

In an example operation, the PA controller 210 may receive an input signal 201, which is to be amplified, and may use that input signal, and/or other parameters (e.g., pre-programmed settings, etc.), to drive and control the PA 220, to effectuate the desired amplification. In particular, the PA controller 210 may be operable to adaptively control operations of the PA 220, such as by adaptively generating output signals that are used in driving or modifying operation of the PA 220. The controlling may comprise dynamically biasing the PA 220, particularly to enhance power consumption and efficiency of the PA 220. For example, using its output signals, the PA controller 210 may drive the PA 220 to cause it to produce common mode current that will be rejected by the balun 230 at the output of the PA 220. This may allow support for large peaks without degrading efficiency.

In the example implantation depicted in FIG. 2, based on the input signal 201, the DAC circuits 214 and 216 of the PA controller 210 may drive the PA 220 via a pair of signal lines $215_P$ and $215_N$. Each of the lines $215_P$ and $215_N$ may concurrently carry the signal to be amplified, being provided from the signal DAC circuit 214, and bias current from the bias DAC circuit 216. In an example implementation, the bias DAC circuit 216 may comprise dedicated current sources $218_P$ and $218_N$, each for applying a respective bias current to corresponding one of the signal lines $215_P$ and $215_N$.

The PA controller 210 may be operable to adaptively control operations of the PA 220, such as by adaptively controlling the signals output via the signal lines $215_P$ and $215_N$. As noted before, the controlling may comprise dynamically biasing the PA 220, particularly to enhance power consumption and efficiency of the PA 220. Thus, with reference to the example implantation depicted in FIG. 2, the current sources $218_P$ and $218_N$ of the bias DAC 216 may be controlled jointly, for example, to output the same currents in the signal lines $215_P$ and $215_N$, to produce common mode current that will be rejected by the balun 230 at the output of the PA 220, thus allow support for large peaks without degrading efficiency.

In the example implantation depicted in FIG. 2, the biasing control circuit 212 may be operable to control or adjust functions of the PA controller 210, to effectuate the desired driving or controlling of the PA 220, based on the input signal 201 and/or other parameters. The biasing control circuit 212 may be operable to, for example, generate signals within the PA controller 210 (e.g., signals 211 and 213) to drive or control other components of the PA controller 210, such as the signal DAC circuit 214 and the bias DAC circuit 216. For example, the dynamic biasing control circuit 212 receives the (to be amplified) input signal 201, and generates corresponding signal 213 that is applied to the PA 220, after digital-to-analog conversion via the signal DAC circuit 214, as well as corresponding biasing control signal 211, which control operations of the bias DAC circuit 216. Example implementations of the biasing control circuit 212 are described in more detail with reference to FIGS. 3 and 4.

In some instances, the dynamic biasing of the power amplifiers (e.g., the PA 220) may change the operating conditions of the power amplifier, which may possibly result in distortion due to AM-AM and/or AM-PM effects. Accordingly, in some example implementations, the controlling of power amplifiers may be configured to account for such distortion. For example, such distortion performance of the power amplifier with dynamic biasing may be improved and/or mitigated by incorporating particular remedial and/or preemptive steps to account for it, in the power amplifier controller (e.g., the PA controller 210). The PA controller 220 may be configured or implemented, for example, to pre-distort (e.g., in the digital domain) the signal that is to be amplified, to compensate for these AM-AM and AM-PM effects. For example, the dynamic biasing control circuit 212 may be configured to apply such pre-distortion, before generating the control signals 211 and 213, such that the driving and/or controlling (including biasing) of the PA 220 would already account for the anticipated distortion.

Figure 3:
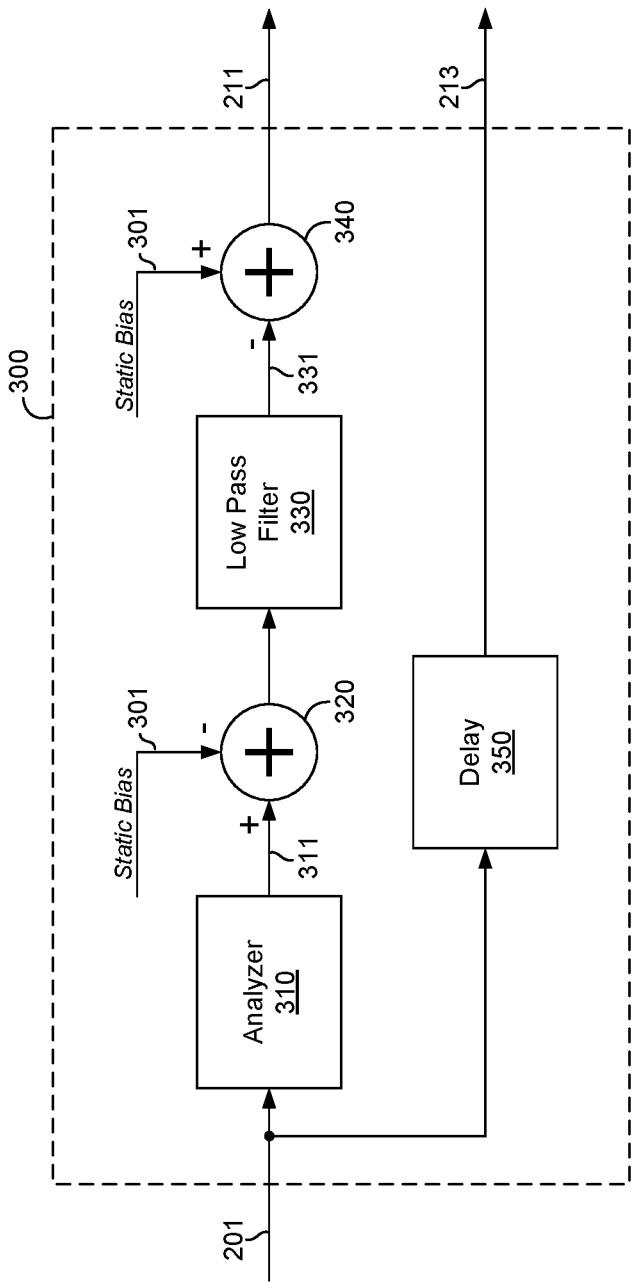
FIG. 3 depicts an example dynamic biasing control circuit, in accordance with an implementation of the present disclosure.

FIG. 3 depicts an example dynamic biasing control circuit, in accordance with an implementation of the present disclosure. Shown in FIG. 3 is a dynamic biasing control circuit 300.

The dynamic biasing control circuit 300 may be operable to generate control signals, for use in controlling power amplifiers, particularly for dynamically biasing such amplifiers. The dynamic biasing control circuit 300 may be an example implementation of the dynamic biasing control circuit 212 of FIG. 2. Accordingly, the dynamic biasing control circuit 300 may operate in a substantially similar manner to that of the dynamic biasing control circuit 212, as described with reference to FIG. 2—that is by receiving an input signal which is to be amplified (e.g., signal 201), and generating based on that input signal corresponding intermediate signals (e.g., signal 211 and 213) that are used with a power amplifier controller (e.g., PA controller 210) in conjunction with driving and controlling a power amplifier (e.g., PA 220). In the example implementation depicted in FIG. 3, the dynamic biasing control circuit 300 may comprise an analyzer circuit 310, combiners 320 and 340, a low-pass filter circuit 330, and a delay circuit 350.

In an example operation, the signal 201 may be received by the dynamic biasing control circuit 300, and may be analyzed by the analyzer circuit 310. In this regard, the analyzer circuit 310 may analyze the signal 201, in the digital domain, to determine when the peaks of the signal 201 may need a higher current in the power amplifier. For example, analyzer circuit 310 may be operable to determine an absolute value of the analyzed signal (e.g., signal 201), and to detect and hold peaks of the analyzed signal. Based on the analysis perform by the analyzer circuit 310, the biasing of the power amplifier may be controlled. In this regard, the dynamic biasing control circuit 300 may generate a biasing control signal (e.g., signal 211, used to control the bias DAC 216) based on the analysis performed by analyzer circuit 310.

In the example implementation depicted in FIG. 3, the signal 211 may be generated based on the output signal (shown as signal 311) of the analyzer circuit 310 by subtracting from that output signal, via the combiner 320, static bias 301. The static bias 301 may be provided as an input to the dynamic biasing control circuit 300. For example, the static bias 301 may be provided as feedback by the component of the power amplifier controller (e.g., the biasing DAC 216 of the PA controller 210) that generates and/or applies the biasing. The removal of the static bias leaves only the portion of the signal pertinent to dynamic biasing. The low-pass filter circuit 330 may be configured to apply bias shaping filtering, after removal of the static biasing. The static bias 301 may then be reintroduced via the combiner 340, to generate the overall biasing control signal (signal 211).

The second output control signal (signal 213), which is used to drive the non-biasing component of the power amplifier controller (e.g., the signal DAC 214 of the PA controller 210) may simply be a copy of the input signal 201. The delay circuit 350 may be used, however, to delay outputting that signal, such as to account for the time needed to perform the analysis and/or following functions required for generating the biasing control signal, such that the two signals are applied to the other components of the PA controller 210 at the right time. Thus, the delay circuit 350 may be configured to adaptively apply delays in a manner that account, in real-time, for the time being used to generate the biasing control signal.

In an example implementation, the dynamic biasing control circuit 300 may be configured to account for and/or mitigate distortion that may occur in the power amplifier due to AM-AM and/or AM-PM effects, particularly due to dynamic biasing of the power amplifier. The AM-AM and/or AM-PM effects, and/or distortion caused thereby, may be determined based on feedback input, pre-programmed information etc. For example, the analyzer circuit 310 may be operable to pre-distort the input signal 201, in the digital domain, to compensate for the anticipated AM-AM and AM-PM effects. Thus, the biasing control signal 213 may be generated to account for the anticipated distortion, and the biasing performed based thereon would already account for the anticipated distortion.

Figure 4:
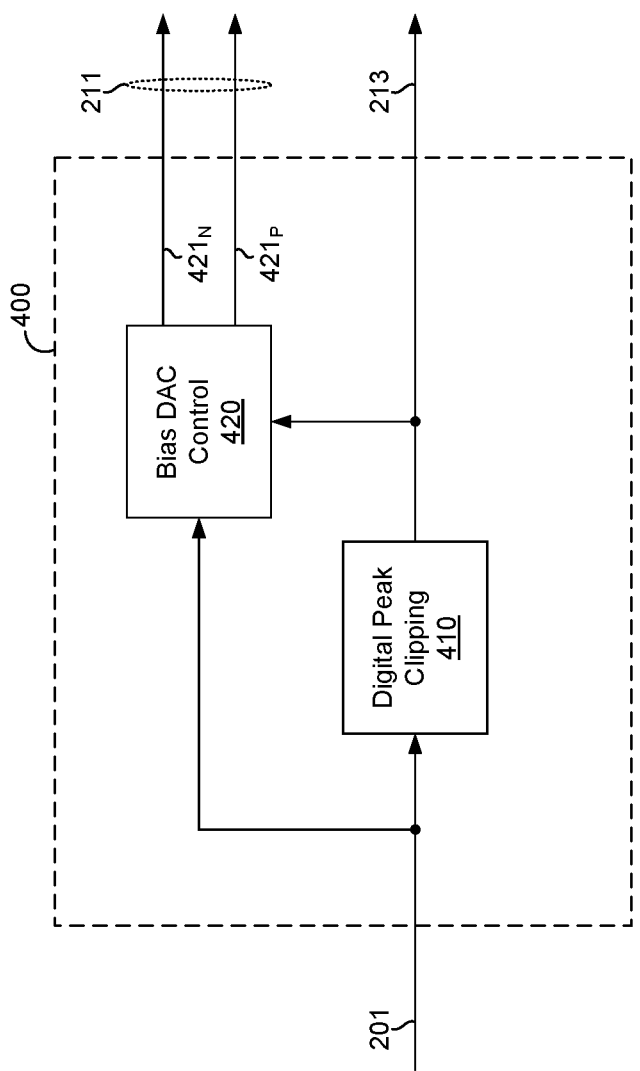
FIG. 4 depicts an example dynamic biasing control circuit, in accordance with an alternate implementation of the present disclosure.

FIG. 4 depicts an example dynamic biasing control circuit, in accordance with an alternate implementation of the present disclosure. Shown in FIG. 4 is a dynamic biasing control circuit 400.

The dynamic biasing control circuit 400 may be operable to generate control signals, for use in controlling power amplifiers, particularly to dynamically bias such amplifiers. The dynamic biasing control circuit 400 may be an alternative example implementation of the dynamic biasing control circuit 212 of FIG. 2. Accordingly, similar to the dynamic biasing control circuit 300 of FIG. 3, the dynamic biasing control circuit 400 may operate in a substantially similar manner to that of the dynamic biasing control circuit 212, as described with reference to FIG. 2—that is by receiving an input signal which is to be 'amplified' (e.g., signal 201), and generating based on that input signal corresponding intermediate signals (e.g., signal 211 and 213) that are used with a power amplifier controller (e.g., PA controller 210) in conjunction with driving and controlling a power amplifier (e.g., PA 220). As shown in the example implementation depicted in FIG. 4, the dynamic biasing control circuit 400 may comprise a digital peak clipping circuit 410 and a bias DAC control circuit 420.

In an example operation, the signal 201 may be received by the dynamic biasing control circuit 400, which may in response generate a biasing control that is used to drive the biasing component of a power amplifier controller (e.g., signal 211, used to control the bias DAC 216), and second output control signal (signal 213), which is used to drive the non-biasing component of the power amplifier controller (e.g., the signal DAC 214 of the PA controller 210).

The dynamic biasing control circuit 400 may be operable, however, to support differential biasing. For example, with reference to the implementation of the overall transmitter (or portion thereof) depicted in FIG. 2, instead of controlling current sources $218_P$ and $218_N$ to introduce on-demand common mode bias current as discussed above, the dynamic biasing control circuit 400 may be operable to generate separate control signals for each of the current sources $218_P$ and $218_N$ of the bias DAC circuit 216, such that the current sources $218_P$ and $218_N$ may be controlled separately to provide differential bias current. The digital peak clipping circuit 410 may generate, based on the input signal 201, two separate biasing control signals, $421_P$ and $421_N$, configured to control respective one of the current sources $218_P$ and $218_N$. Thus, the biasing control signal 211 fed into the bias DAC 216 may actually comprise two different control signals $421_P$ and $421_N$, for individually controlling the current sources $218_P$ and $218_N$, respectively.

The differential biasing may be used in combination with intentional clipping in the digital domain to better control the characteristics of the output signal. For example, the input signal 201 may be fed into the digital peak clipping circuit 410, which may apply intentional clipping, in the digital domain, to better control the characteristics of the output signal. The output of the digital peak clipping circuit 410 may be passed on to the non-biasing output signal 213. Further, in some instances, a copy of the output of the digital peak clipping circuit 410 may be fed into bias DAC control circuit 420, which may then generate the two biasing control signals 421$_P$ and 421$_N$, which are configured to control the respective one of the current sources 218$_P$ and 218$_N$, based on that output as well as the original input signal 201.

With the use of intentional clipping, the positive- and negative-side signals may be clipped, before feeding them to the positive and negative nodes of the power amplifier. In other words, the two input signals from the DAC to the amplifier (signal lines 215$_P$ and 215$_N$) may no longer be differential, resulting in the power amplifier having two clipped signals instead. This is shown in more detail with respect to FIGS. 5A and 5B.

FIG. 5A depicts example output current waveforms without action having been taken to prevent clipping in a power amplifier.

As illustrate in FIG. 5A, the distortion resulting from the negative peaks for each of the positive and negative side output line currents ($I_{out\_P}$ and $I_{out\_N}$) of a power amplifier may get close to and even hitting 0 mA. As a result, the overall bias current ($I_{out}$) may be uncontrolled and may have unpredictable results.

FIG. 5B depicts example output current waveforms with digital clipping and corresponding compensation in a power amplifier.

As illustrate in FIG. 5B, negative peaks for each of the positive and negative side output line currents ($I_{out\_P}$ and $I_{out\_N}$) may be digitally clipped in the digital domain (e.g., by a suitable component, such as the digital peak clipping circuit 410), such that the resulting shape of the output current ($I_{out}$) waveform may be controlled and predictable. If the digital clipping were used without corresponding adjustment of the bias current, the result may be lost signal information. In accordance with an example implementation of the present disclosure, however, the digital clipping may be used in combination with controlled differential bias current (e.g., provided by the bias DAC 216), to prevent loss of signal information. Specifically, the current digitally clipped from the negative peaks of signal line 215$_P$ (or signal line 215$_N$) may be added to positive peals of signal line 215$_N$ (or signal line 215$_P$) such that, when the output is taken differentially, the original waveform may be recovered. This technique may be referred to as Digital Class AB clipping.

Figure 6:
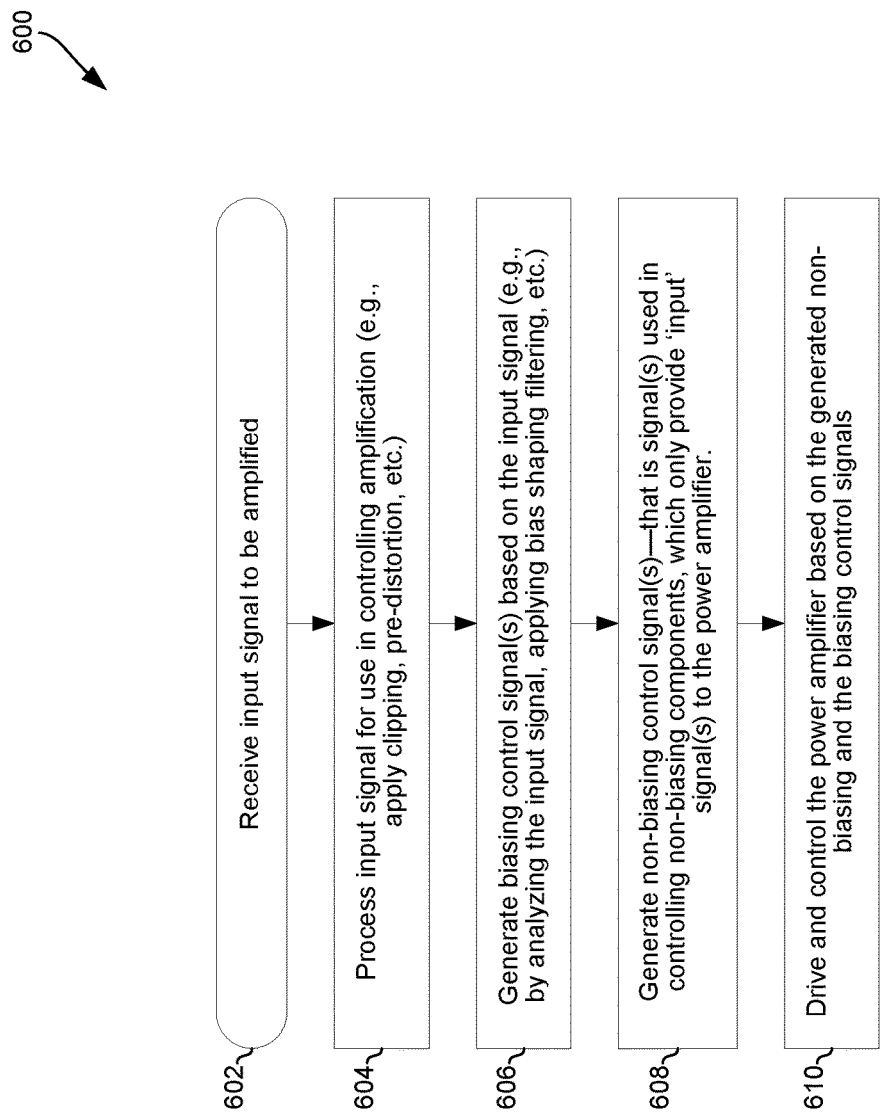
FIG. 6 depicts a flowchart of an example process for dynamic biasing of power amplifiers, in accordance with the present disclosure.

FIG. 6 depicts a flowchart of an example process for dynamic biasing of power amplifiers, in accordance with the present disclosure. Shown in FIG. 6 is flow chart 600, comprising a plurality of example steps (represented as blocks 602-610), which may be performed in a suitable system (e.g., transmitter 200, particularly by power amplifier (PA) controller 210) to dynamically bias a power amplifier (e.g., PA 220), particularly to enhance efficiency.

In step 602, an input signal (e.g., input signal 201) that is to be amplified may be received, and fed into a power amplifier controller sub-system (e.g., PA controller 210).

In step 604, the input signal may be processed, specifically for use in controlling amplification. For example, the clipping (e.g., in the dynamic biasing control circuit 400, via clipping circuit 410), pre-distortion (dynamic biasing control circuit 300, via the analyzer circuit 310), etc. may be applied to the input signal 210. Such processing may configured such that any control performed on the input signal would optimize dynamic biasing of the amplifier (e.g., for efficiency) and/or account for anticipated issues that may be caused by the amplification and/or the dynamic biasing (e.g., distortion due to AM-AM and/or AM-PM effects).

In step 606, biasing control signal(s) may be generated based on the input signal (e.g., by analyzing the input signal, applying bias shaping filtering, etc.). In this regard, the biasing control signal may actually comprise a plurality of biasing signals (e.g., signals 421$_P$ and 421$_N$), each of which being particularly configured to control a respective one of a plurality of biasing related components in the power amplifier controller (e.g., biasing current sources signals 218$_P$ and 218$_N$ of the biasing DAC circuit 216 in the PA controller 220).

In step 608, non-biasing control signal(s) may be generated. In this regard, the non-biasing control signal(s) may be used in controlling non-biasing related components in the power amplifier controller (e.g., signal DAC circuit 214 in the PA controller 220). Such non-biasing related component(s) may simply provide "input" signal(s) to the power amplifier, with the biasing being applied (separately or on the same signal lines) by the biasing component(s). In some instances, measures may be taken to ensure that the non-biasing and biasing control signals are generated in a timely manner—that is to enable them to act together at the proper time. For example, because generating the biasing signal(s) may be more time consuming, the non-biasing signal(s) may be delayed before being output and applied to the non-biasing component(s), to allow for sufficient time to generate and apply the biasing signal(s) to the biasing component(s).

In step 610, the power amplifier may be driven and controlled by the power amplifier controller based on the non-biasing and the biasing control signals.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
processing an input signal, wherein said processing comprises:
determining one or more parameters of said input signal; and
applying clipping to said input signal;
controlling based on said processing of said input signal, a power amplifier (PA) that amplifies said input signal, wherein said controlling comprises adjusting biasing applied to said power amplifier (PA) based on said one or more parameters of said input signal; and
configuring said clipping such that signals applied to positive and negative sides of said power amplifier (PA) are not differential.

2. The method of claim 1, comprising determining, during said processing of said input signal, an absolute value of said input signal.

3. The method of claim 1, wherein said one or more parameters are associated with one or more characteristics of said input signal that are relevant to biasing of said power amplifier (PA).

4. The method of claim 3, wherein said one or more characteristics of said input signal comprise peaks in said input signal; and
said controlling comprises adjusting operation of said power amplifier (PA) to account for said detected peaks.

5. The method of claim 1, comprising configuring said processing of said input signal and/or said controlling of said power amplifier (PA) based on anticipated performance related issues in said power amplifier (PA) when said input signal is amplified.

6. The method of claim 1, comprising applying, during said processing of said input signal, pre-distortion to account for anticipated distortion in said power amplifier (PA) when said input signal is amplified.

7. The method of claim 1, wherein said controlling of said power amplifier (PA) comprises generating a plurality of control signals that is applied during said controlling.

8. The method of claim 7, wherein said plurality of control signals comprise a plurality of biasing control signals, with each one of said plurality of biasing control signals being configured to control a respective one of a plurality of biasing control elements.

9. A system, comprising:
a power amplifier (PA) circuit operable to amplify an input signal; and
one or more control circuits operable to:
process said input signal, wherein said processing comprises:
determining one or more parameters of said input signal; and
applying clipping to said input signal;
control said power amplifier (PA) circuit based on said processing of said input signal, wherein said controlling comprises adjusting biasing applied to said power amplifier (PA) circuit based on said one or more parameters of said input signal; and
configure said clipping such that signals applied to positive and negative sides of said power amplifier (PA) circuit are not differential.

10. The system of claim 9, wherein said one or more control circuits are operable to determine, during said processing of said input signal, an absolute value of said input signal.

11. The system of claim 9, wherein said one or more parameters are associated with one or more characteristics of said input signal that are relevant to biasing of said power amplifier (PA) circuit.

12. The system of claim 11, wherein said one or more characteristics of said input signal comprise peaks in said input signal; and
wherein said one or more control circuits are operable to adjust operation of said power amplifier (PA) circuit to account for said detected peaks.

13. The system of claim 9, wherein said one or more control circuits are operable to process said input signal and/or generate said plurality of control signals based on anticipated performance related issues in said power amplifier (PA) circuit when said input signal is amplified.

14. The system of claim 9, wherein said one or more control circuits are operable to apply, during said processing of said input signal, pre-distortion to account for anticipated distortion in said power amplifier (PA) circuit when said input signal is amplified.

15. The system of claim 9, wherein said one or more control circuits are operable to generate a plurality of control signals that is applied during said controlling.

16. The system of claim 15, comprising a plurality of biasing control elements;
wherein said plurality of control signals comprise a plurality of biasing control signals, with each one of said plurality of biasing control signals being configured to control a respective one of said plurality of biasing control elements.

* * * * *